United States Patent
Maxey et al.

(10) Patent No.: US 10,925,168 B2
(45) Date of Patent: Feb. 16, 2021

(54) METHODS FOR FORMING OF FLEXIBLE CIRCUITRY LAYERS

(71) Applicant: LOOMIA Technologies, Inc., New York, NY (US)

(72) Inventors: Madison Thea Maxey, New York, NY (US); Janett Martinez, Queens, NY (US); Ezgi Uçar, Istanbul (TR)

(73) Assignee: Loomia Technolgies, Inc., New York, NY (US)

( * ) Notice: Subject to any disclaimer, the term of this patent is extended or adjusted under 35 U.S.C. 154(b) by 0 days.

(21) Appl. No.: 15/994,415

(22) Filed: May 31, 2018

(65) Prior Publication Data

US 2019/0373733 A1    Dec. 5, 2019

(51) Int. Cl.
| H05K 1/18 | (2006.01) |
| H05K 3/00 | (2006.01) |
| H05K 3/04 | (2006.01) |
| G06F 3/044 | (2006.01) |
| H05K 3/32 | (2006.01) |
| H05K 1/02 | (2006.01) |

(52) U.S. Cl.
CPC ............. *H05K 1/189* (2013.01); *G06F 3/044* (2013.01); *H05K 1/0213* (2013.01); *H05K 3/0011* (2013.01); *H05K 3/043* (2013.01); *H05K 3/32* (2013.01); *G06F 2203/04112* (2013.01)

(58) Field of Classification Search
CPC ......... A43B 19/00; A43B 1/14; A43B 3/0005; A43B 7/04; A43B 7/12; H02J 7/0021; H02J 7/025; H05B 1/0252
See application file for complete search history.

(56) References Cited

U.S. PATENT DOCUMENTS

| 4,808,274 A * | 2/1989 | Nguyen ................. C03C 17/40 205/125 |
| 5,059,242 A * | 10/1991 | Firmstone .............. C23C 18/08 106/1.18 |
| 6,014,805 A * | 1/2000 | Buixadera Ferrer ........................ H05K 1/0265 216/13 |
| 6,729,025 B2 * | 5/2004 | Farrell ...................... B32B 3/08 29/825 |
| 7,115,844 B2 * | 10/2006 | Ferguson ................ A61F 7/007 219/549 |
| 10,051,898 B2 * | 8/2018 | Maxey ............... A41D 13/0051 |
| 2007/0245557 A1 * | 10/2007 | Baer .................... G11B 5/1278 29/852 |
| 2014/0225839 A1 * | 8/2014 | Dunphy ................. G06F 3/044 345/173 |
| 2017/0086513 A1 * | 3/2017 | Maxey ............... A41D 13/0051 |

\* cited by examiner

*Primary Examiner* — Minh N Trinh
(74) *Attorney, Agent, or Firm* — Bookoff McAndrews, PLLC

(57) ABSTRACT

A mechanical subtractive method of manufacturing a flexible circuitry layer may include mechanically removing at least a portion of a conductive mesh, wherein, following the mechanical removal, a remaining portion of the conductive mesh forms at least a portion of a circuitry trace comprising an electrode; forming an electrical connection between the electrode and a terminal of an interfacing component, wherein the interfacing component comprises a connector; and encasing at least a portion of the circuit trace with an insulative layer.

9 Claims, 7 Drawing Sheets

METHODS FOR FORMING OF FLEXIBLE CIRCUITRY LAYERS

TECHNICAL FIELD

The present disclosure relates generally to the field of drapable, flexible, electronic circuitry layers and circuit boards, including stretchable electronic circuitry layers.

BACKGROUND

It may be desirable to incorporate electronic circuitry into a wide variety of soft goods, including textiles (e.g., clothing and/or home goods such as blankets) or upholstered products (e.g., furniture or automotive products) and into partially soft goods (e.g., shoes, handbags, and tents). Traditional methods of manufacturing electronic circuitry have resulted in circuitry that is insufficiently flexible and drapable to be satisfactorily incorporated into such soft good products. Such traditional methods have also produced circuitry that lacks other desirable properties, such as durability (including washability), adaptability to different applications, and ease of integration.

Therefore, a need exists for a flexible electronic circuitry layer that is drapable, has a low bend radius, and is able to be integrated into a variety of soft good products.

SUMMARY

According to certain aspects of the present disclosure, methods for producing drapable electronic circuitry layers are disclosed.

In one embodiment, mechanical subtractive method of manufacturing a flexible circuitry layer is disclosed, the method comprising: mechanically removing at least a portion of a conductive mesh, wherein, following the mechanical removal, a remaining portion of the conductive mesh forms at least a portion of a circuitry trace comprising an electrode; forming an electrical connection between the electrode and a terminal of an interfacing component, wherein the interfacing component comprises a connector; and encasing at least a portion of the circuit trace with an insulative layer.

In accordance with another embodiment, a chemical subtractive method of manufacturing a flexible circuitry layer is disclosed, the method comprising: applying a mask layer to at least one side of a mesh coated with conductive material; applying a chemical to the mesh, wherein the chemical is configured to remove at least a portion of the conductive material not covered by the mask layer, and wherein, after the chemical is applied, a remaining portion of the conductive material forms at least a portion of a circuitry trace comprising an electrode; forming an electrical connection between the electrode and a terminal of an interfacing component, wherein the interfacing component includes a connector; and encasing at least a portion of the circuit trace with an insulative layer.

In accordance with another embodiment, A subtractive method of manufacturing a flexible circuitry layer is disclosed, the method comprising: removing at least a portion of a conductive material from a mesh, wherein, following the removal, a remaining portion of the conductive material forms at least a portion of a circuitry trace including an electrode; forming an electrical connection between the electrode and a terminal of an interfacing component comprising a connector; encasing at least a portion of the circuit trace with an insulative layer; and forming an electrical connection between the connector and an external device.

Additional objects and advantages of the disclosed embodiments will be set forth in part in the description that follows, and in part will be apparent from the description, or may be learned by practice of the disclosed embodiments. The objects and advantages on the disclosed embodiments will be realized and attained by means of the elements and combinations particularly pointed out in the appended claims.

It is to be understood that both the foregoing general description and the following detailed description are exemplary and explanatory only and are not restrictive of the detailed embodiments, as claimed.

It may be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate exemplary embodiments of the present disclosure and together with the description, serve to explain the principles of the disclosure.

DETAILED DESCRIPTION

While principles of the present disclosure are described herein with reference to illustrative embodiments for particular applications, it should be understood that the disclosure is not limited thereto. Those having ordinary skill in the art and access to the teachings provided herein will recognize additional modifications, applications, embodiments, and substitution of equivalents all fall within the scope of the embodiments described herein. Accordingly, the invention is not to be considered as limited by the foregoing description.

Various non-limiting embodiments of the present disclosure will now be described to provide an overall understanding of the principles of the methods described herein for producing flexible, drapable electronic circuitry layers.

As discussed above, existing methods fail to produce electronic circuitry layers with sufficient flexibility for integration into a variety of soft good products. Thus, the exemplary embodiments of the present disclosure are directed to creating drapable electronic circuitry layers which may be integrated into a wide range of soft good products. For example, flexible circuitry layers may be produced via subtractive manufacturing using a conductive mesh. Such subtractive manufacturing methods may include mechanical and chemical subtractive manufacturing. Circuit traces formed from a conductive mesh may be integrated into a circuitry layer which may include insulative material, an electronic component, and/or an interfacing portion.

One or more examples of these non-limiting embodiments are illustrated in the selected examples disclosed and described in detail with reference to FIGS. 1-11 in the accompanying drawings. Those of ordinary skill in the art will understand that systems and methods specifically described herein and illustrated in the accompanying drawings are non-limiting embodiments. The features illustrated or described in connection with one non-limiting embodiment may be combined with the features of other non-limiting embodiments. Such modifications and variations are intended to be included within the scope of the present disclosure. The examples described with regard to FIGS. 1-11 may be used in large-scale manufacturing.

Figure 1:
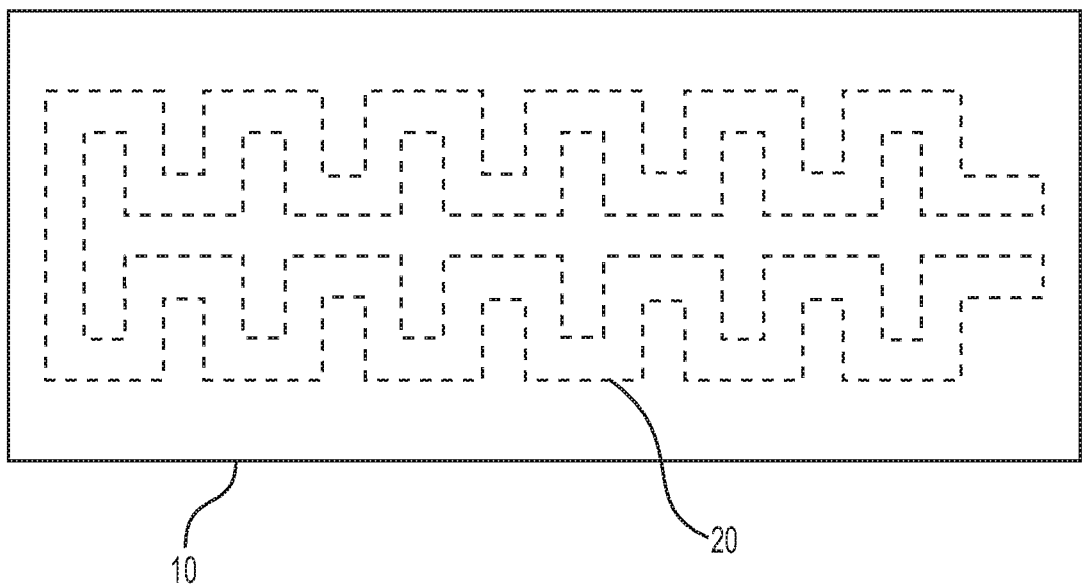
FIG. 1 shows an exemplary mesh having a circuitry pattern.
Figure 2:
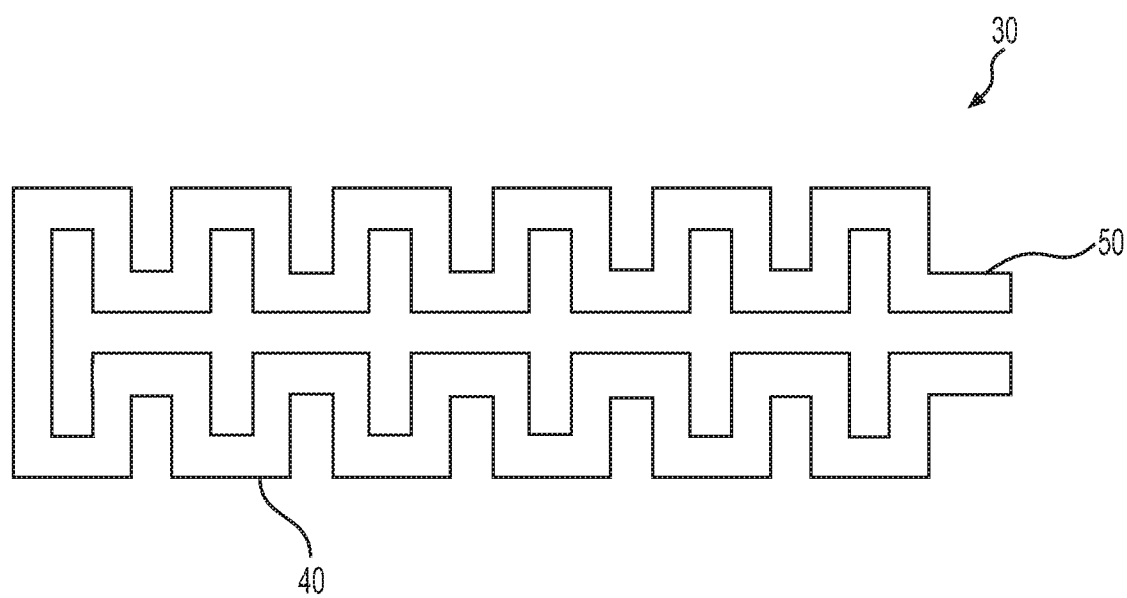
FIG. 2 shows an exemplary mesh which has been formed into a circuit trace.
Figure 3:
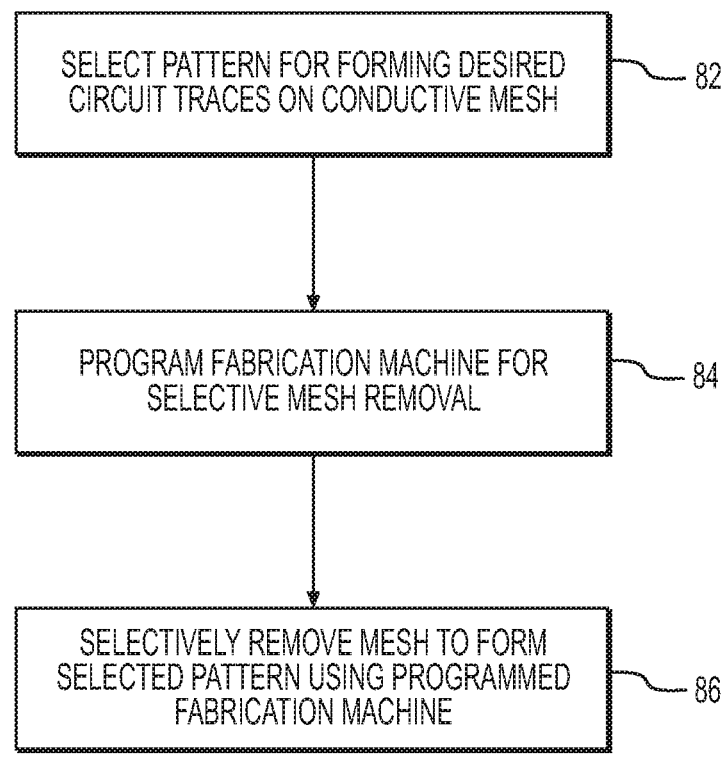
FIG. 3 is a process flow diagram showing an exemplary process for mechanical subtractive manufacturing of mesh into a circuitry layer.

As shown in FIGS. 1-3, mechanical subtractive manufacturing methods may be used in order to form a circuitry trace layer such as circuitry trace layer 30, as described with regard to FIG. 2 below. FIG. 1 shows a flexible material 10 which may be, for example, a textile, such as a woven textile, a knit fabric, a mesh, or any other type of flexible material. Flexible material 10 may include either natural or synthetic fibers or other materials. For example, flexible material 10 may include one or more materials such as cotton, flax, jute, hemp, modal, bamboo, silk, nylon, velvet, polyester, rayon, or taffeta. Flexible material 10 may include a metal or metal alloy material such as a conductive material. For example, flexible material 10 may include materials such as, for example, copper, nickel, silver, tin, and/or cobalt. For convenience, flexible substrate 10 may be referred to herein as a conductive mesh 10. However, it will be understood that the disclosures are not limited to a conductive mesh and may include any other suitable material, such as those described above. Conductive mesh 10 may be provided in sheets or other pieces of any suitable size and shape.

Subtractive manufacturing methods may be used to remove portions of conductive mesh 10. For example, a computer-numeric controlled (CNC) cutter may be used. A cutter may be, for example, a die cutter or a laser cutter. A cutter may be specially configured to be used with textiles, such as conductive mesh 10, or a cutter may be a general-use cutter, which can also be used with, for example, vinyl. For example, a cutter may be used to cut conductive mesh 10 according to a pattern 20. In one example, the cutter may be a CNC cutter or other automated or computerized cutter that may be programmed to cut according to a pattern 20. In the alternative, a manual cutter may be used to manually cut along a pattern such as pattern 20. In one embodiment, pattern 20 may be in a shape or pattern corresponding to a circuit trace. A cutter may cut along a bias of conductive mesh 10 or along a grain of conductive mesh 10. Cutting on the bias may make the mesh more likely to stretch internally, increasing resistance when there is vertical or horizontal strain. Cutting the geometry on the straight grain may keep the material from stretching unless there is diagonal pressures, making the element more stable regarding resistance upon stretching.

As shown in FIG. 2, cutting of conductive mesh 10 according to pattern 20 may form at least a portion of a circuitry trace layer 30. A textile such as a conductive mesh 10, may be configured to transmit electricity, for example via conductive fibers woven into conductive mesh 10, conductive fibers woven together to form conductive mesh 10, doping, or coating conductive mesh 10 with a conductive material. Circuitry trace layer 30 may include one or more circuit traces 40 and one or more electrodes 50. Circuitry trace layer 30 may be used in combination with other circuitry trace layers 30 or without other circuitry trace layers 30. Circuitry trace layer 30 may have no or minimal change in resistance of the circuitry traces upon stretching.

FIG. 3 describes an exemplary method for using mechanical subtractive manufacturing to form, for example, circuitry trace layer 30. For example, in step 82, a pattern may be selected for forming circuitry traces 40. A pattern may be selected in step 82 based on design rules. As discussed, for example, in FIGS. 7 and 8, below, circuitry traces 40 may include regions with varying functionality (e.g., heating, lighting, and/or capacitive touch). In step 84, a cutter, such as a CNC or other automated cutter, may be programmed to cut circuitry trace layer 30 according to desired a pattern, such as pattern 20. If a manual cutter is used, step 84 may be omitted. In step 86, a conductive mesh 10 or other type of flexible material may be cut according to the selected pattern using a cutter. The examples described with regard to FIGS. 1-3 may produce a stretchable circuitry trace layer 30, depending on the flexible mesh 10 used to construct circuitry trace layer 30.

Figure 4:
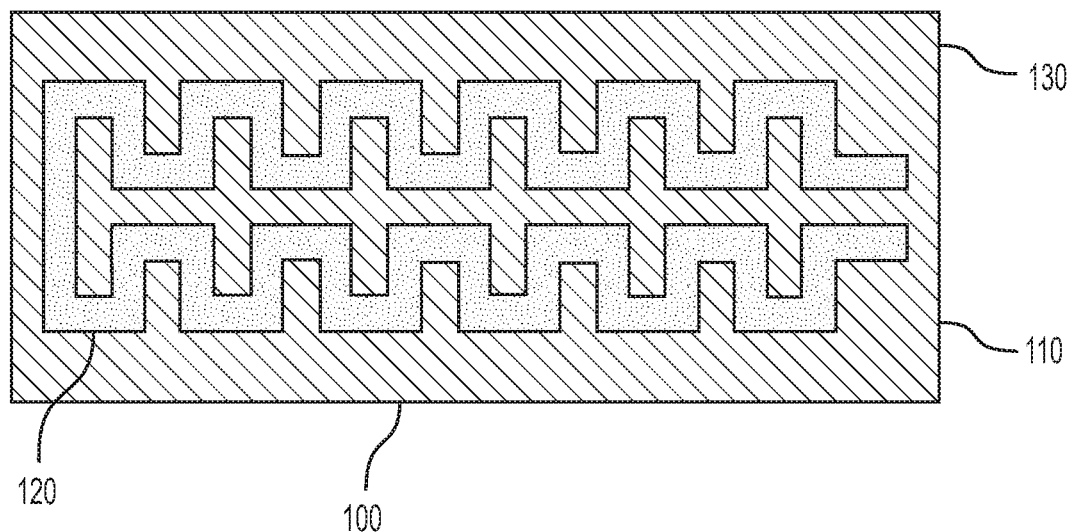
FIG. 4 shows an exemplary conductive mesh overlaid by a mask.
Figure 5:
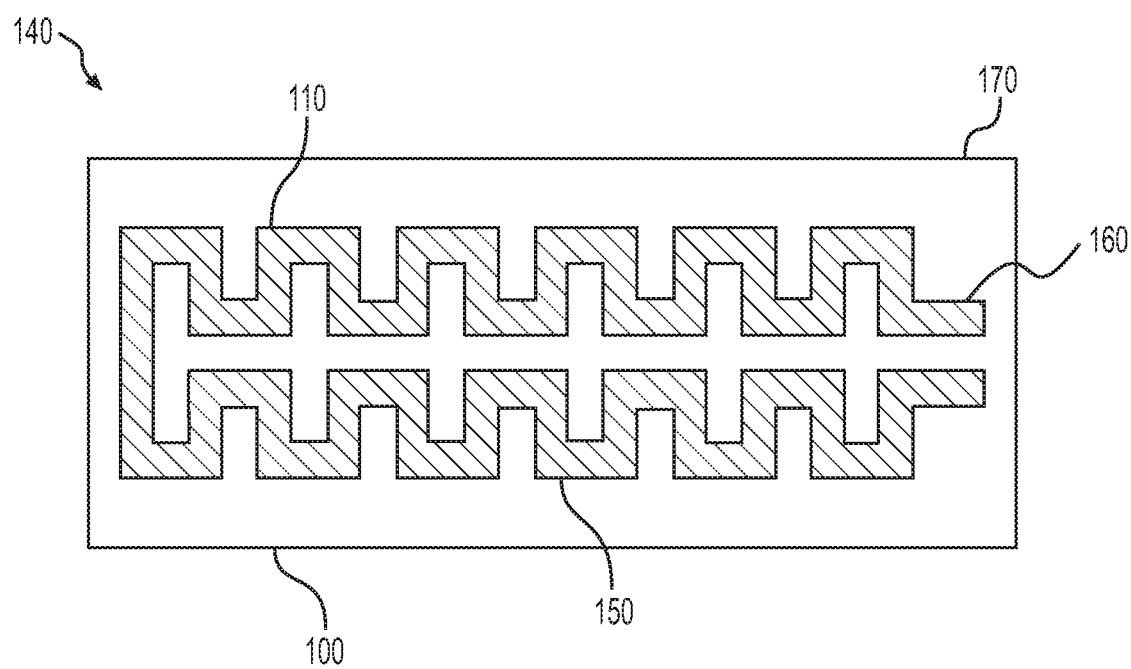
FIG. 5 shows an exemplary mesh including a circuit trace.
Figure 6:
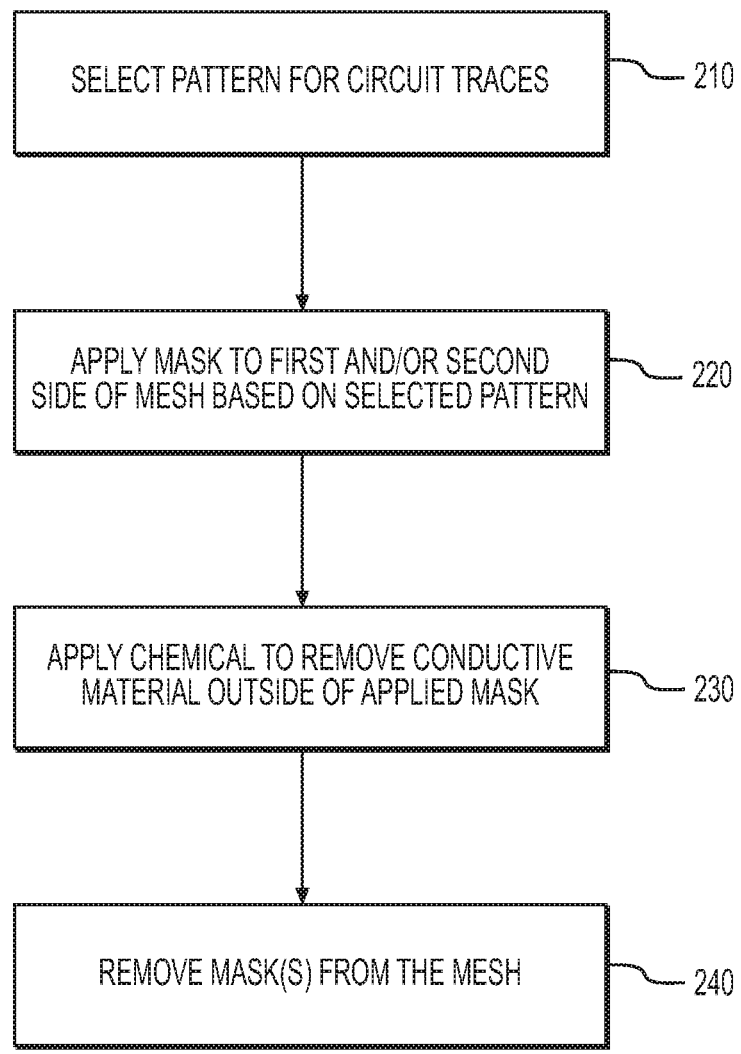
FIG. 6 is a process flow diagram showing an exemplary process for chemical subtractive manufacturing.

As shown in FIGS. 4-6, chemical subtractive manufacturing method 200 may also or alternatively be used to manufacture a circuitry trace layer 140, as described with regard to FIG. 5, below. FIG. 4 shows a flexible material 100 which may have any of the properties of flexible material or conductive mesh 10 described above. For convenience, the examples described below may refer to flexible material 100 as mesh 100. However, it will be understood that the use of the term mesh is not limiting as to the potential properties of flexible material 100. In one embodiment, mesh 100 may be coated with a conductive material 110 on one or both sides of mesh 100. Conductive material 110 may include any suitable conductive or partially conductive material. For example, conductive material 110 may include a metal, such as copper or a metal alloy, which may include copper, silver, zinc, aluminum, nickel, and/or silicon. Mesh 100 may be coated, impregnated, or otherwise provided with conductive material 110 on one or both sides.

As described in step 210 with regard to FIG. 6, a pattern may be selected for forming desired circuit traces from a flexible conductive material. As described in FIGS. 4 and 6, in step 220, a mask 120 may be placed over at least a portion of conductive material 110 on one or both sides of mesh 100. Mask 120 may be in the shape or pattern of a desired circuit trace, as selected in step 210, described above. At least a portion 130 of conductive material 110 may remain uncovered by mask 120. Mask 120 may be resistant to etching by a chemical, such as a chemical etchant configure to remove conductive material 110 from mesh 100. In one embodiment, mask 120 may be formed by using a CNC (e.g., die or laser cutter) or other cutter, such as described above with regard to FIGS. 1-3.

For example, a cutter may be used to form mask 120 and/or to make a stencil or other layer for forming mask 120. While a variety of materials may be used for making such a stencil or layer, a vinyl sheet will be referred to herein for convenience, and without limiting the scope of the disclosure. For example, a cutter may be used to cut out a pattern from a vinyl sheet where the vinyl corresponding to mask 120 is cut out. The patterned vinyl sheet may then be applied to mesh 100. After application of such a vinyl sheet, material corresponding to mask 120 would be left exposed (in other words, portion 130 would be covered by such a vinyl sheet). Any desired substance or material (e.g., an etch-resist) that is resistant to the selected chemical, e.g., etchant, may be applied to the mesh 100. For example, such a resistant material may be applied via spraying or rolling.

By way of another example, a mask may be formed from a material such as vinyl and may be adhered to mesh 100. For example, a CNC (e.g., die or laser) or other cutter (as described above) may be used to form mask 120. Mask 120 may include a peel-and-stick material or an iron-on material configured to be adhered to mesh 100. In the alternative, mask 120 may be adhered to mesh 100 by any other suitable method. In yet another example, mask 120 may be screen-printed onto mesh 100 or applied via an inkjet or other type of printer or extruder. As a further example, mask 120 may be applied via lithography or by any other suitable mechanism.

In step 230 (FIG. 6), after mask 120 is applied, a chemical such as an etchant may be applied to all or portions of mesh 100, including portions having conductive material 110. For example, a chemical may be a liquid etchant such as ferric chloride. The chemical may be applied via, for example, spraying or dipping. The effect of the chemical may be to remove conductive material 110 from areas not covered by mask 120. The time that mesh 100 is exposed to a chemical for removing conductive material 110 may depend upon various factors, such as type of material, permeability of the material, thickness of the material, etc. The chemical may subsequently be removed or neutralized (e.g., with a basic solution, such as sodium bicarbonate).

Two or more masks 120 may be placed on an opposite side of mesh 100. For example, masks 120 may be placed on opposite sides of mesh 100, and may cover corresponding portions of conductive material 110 on each side of mesh 100. In other words, the portion of mesh 100 covered by a mask 120 on one side of mesh 100 may be directly opposite a portion of mesh covered by a second mask 120 on an opposite side of mesh 100. For example, with regard to mask 120 as shown in FIG. 4, two masks of the same shape may be placed on opposite sides of mesh 100. In the alternative, masks 120 of different shapes may be applied to one or both sides of mesh 100. For example, one mask 120 may be wider or narrower in some or all portions than another mask 120. Because mesh 100 may be porous to liquid and thus enable a chemical to move laterally through the mesh 100 and past mask 120 (particularly as mesh 100 is exposed to a chemical for a longer period of time), both sides of mesh 100 may be masked and then exposed to a chemical for a limited period of time to achieve complete removal of the conductive material outside of mask 120 while maintaining relatively high transfer accuracy of edges of mask 120 to the final geometry of remaining conductive material 110 on the fabric substrate 100. Sizing of masks 120 on each side of mesh 100 relative to one another may affect a rate of etching.

In an alternative implementation, mesh 100 may be coated with conductive material 110 on its first side only. A mask 120 may be applied over a first side of mesh 100 to isolate select regions of conductive coating 110 from a chemical such as an etchant, and a second side of mesh 100 (not having a coating of conductive material) may be masked fully across its length and width to prevent or limit exposure of the back side of conductive material 110 facing mesh 100. A section of the second mask corresponding to a large unmasked region of mask 120 can be removed or perforated (e.g., with small bores or holes in a grid array) in order to expose the conductive material 110 to additional etchant through the second side of the mesh 100 and to selectively increase the etch rate of a large, corresponding region of the conductive material 110.

In an alternative, mesh 100 may include a coating of conductive material 110 on both sides of mesh 100. At least one mask 120 may be applied to one side of mesh 100. The other side of mesh 100 may remain unmasked (and thus, an applied chemical may remove all of the conductive material from the unmasked side). In the alternative, a second mask 120 may be applied to the other side of mesh 100. Where masks are applied to both sides of mesh 100, the two or more applied masks 120 may be of similar or different shapes. For example, circuit traces defined by masks 120 may serve similar or different functions. Where multiple (e.g., two) masks 120 are applied, a chemical may be applied to remove conductive material 110 outside both masks 120.

FIG. 5 shows an exemplary circuit trace layer 140 which may be produced by application of a chemical, via chemical subtractive manufacturing methods, such as those described above. Chemical subtractive manufacturing methods may include, for example, etching, and a chemical used may be an etchant. After application of a chemical as described above, conductive material 110 may remain in areas that were covered by mask 120. The remaining conductive material 110 may form at least a portion of a circuit trace 150 and may include one or more electrodes 160. More than one circuit trace 150 may be formed on mesh 100, if more than one mask 120 is applied. In step 240 (FIG. 6), all or a portion of mask 120 may be removed (via, e.g., peeling off mask 120 or exposing mask 120 to a chemical solution in order to dissolve the mask material) to expose all or portions of circuit trace 150. Portions 170 of mesh 100 which were not covered with mask 120 may have had conductive material removed from those portions 170, and may no longer conduct electricity.

Where a mask, such as mask 120, is applied to both sides of mesh 100, circuitry traces, such as circuitry traces 150, may be formed on both sides of mesh 100. Circuitry traces 150 on either side of mesh 100 may be the same, similar, or different. Mesh 100 may include electrodes 160. Mesh 100 may also include portions 170 of mesh 100 that are lacking conductive material 110 and therefore do not conduct electricity. Portions 170 may correspond to areas that were not covered by mask 120 when a chemical, such as an etchant, was applied to mesh 100. Such circuitry traces on both sides of mesh 100 may have the same shape or may have different shapes. The steps above regarding application of chemicals to remove conductive material 110 and removal of mask 120 may be followed with regard to multiple masks 120 formed on one side or both sides of mesh 100.

Where circuitry traces 150 are formed on both sides of mesh 100, an electrode 160 on one side of mesh 100 may be coupled to another electrode 160 formed on the other side of mesh 100. For example, electrodes 160 on opposite sides of mesh 100 may be coupled by a conductive thread stitched through mesh 100 and intersecting electrodes 160 on either side of mesh 100. Alternatively, electrodes 160 on alternate sides of mesh 100 may be electrically coupled with a metallic (e.g., chrome-plated brass) rivet or button installed in the mesh 100 and intersecting the electrodes 160 on both sides of mesh 100. In the alternative, electrodes 160 on a first and second side of mesh 100 may be connected by any other suitable mechanism. Mesh 100 may further include other materials used to form a trace or a portion of a trace of an electrical circuit over mesh 100. For example, mesh 100 may include conductive ink or other conductive materials deposited on mesh 100 so as to form circuit traces or portions of circuit traces.

Figure 7:
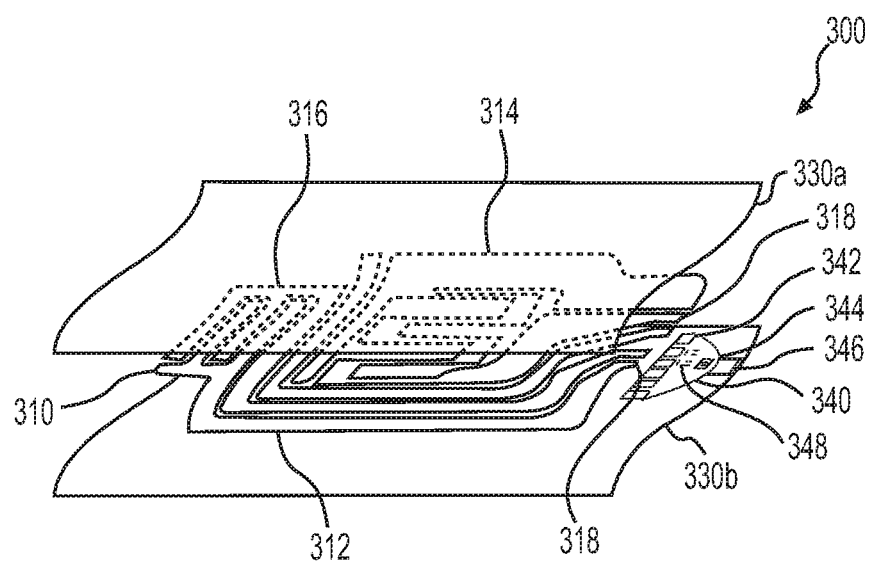
FIG. 7 and FIG. 8 show exemplary electronic circuitry layers.
Figure 8:
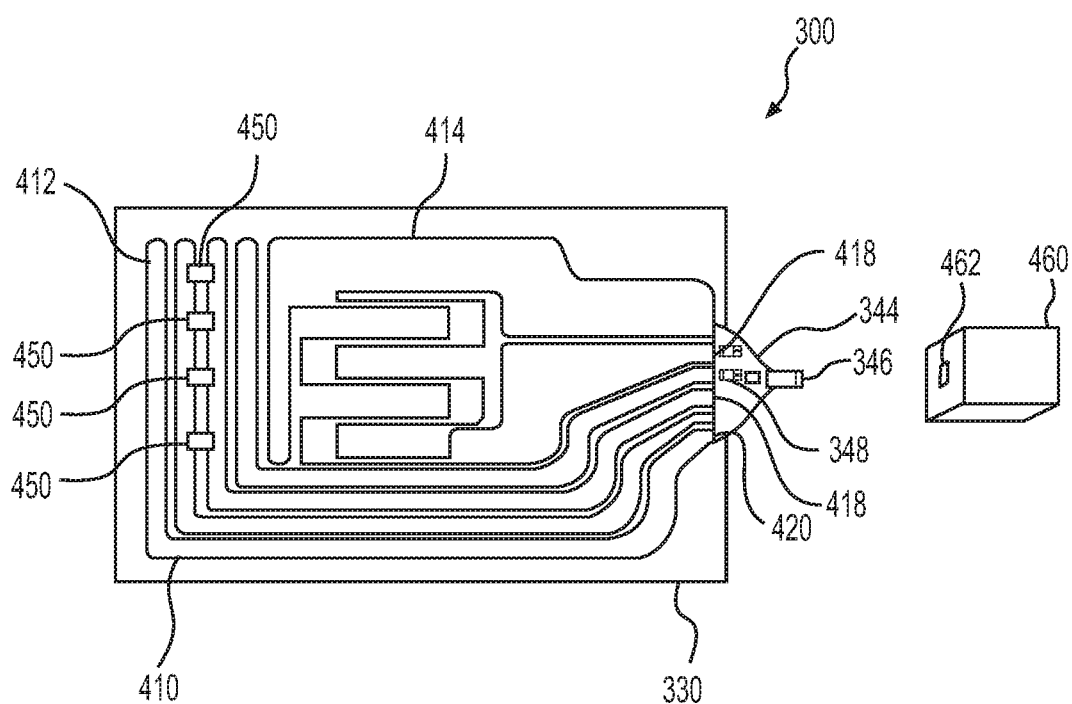
Figure 9:
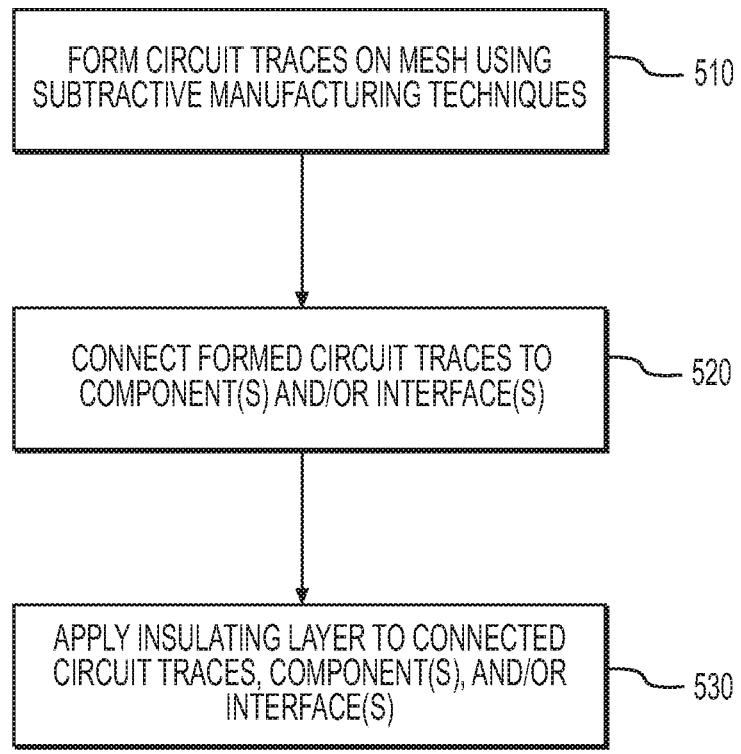
FIG. 9 is a process flow diagram showing an exemplary process for forming an electronic circuitry layer.

FIGS. 7-8 show features of exemplary circuitry layers 300, and FIG. 9 shows an exemplary method for constructing circuitry layer 300. As shown in FIG. 7, circuitry layer 300 may include a circuitry trace layer 310. Circuitry trace layer 310 may have any of the qualities of circuitry trace layers 30 and 140, described with regard to FIGS. 2 and 5, respectively. Circuitry trace layer 310 may include different regions. For example, circuitry trace layer 310 may include a region 312 on which components such as lights (e.g., LED lights) may be mounted. Circuitry trace layer 310 may also include a heating portion 314 which is designed to generate and transmit heat. For example, heating portion 314 may be used to transmit heat to a user, such as a wearer. Circuitry layer 310 may further include a capacitive touch portion 316 which may be reactive to touch or other deformation by, for example, a user. Capacitive touch portion 316 may be used to, for example, control elements of circuitry layer 300. Other regions of circuitry trace layer 310 may include, for example, areas which provide active cooling, form an antenna, or hold sensors. Circuitry trace layer 310 may also include one or more electrodes 318, which may be used for forming electrical connections with other parts.

Circuitry layer 300 may also include one or more insulative layers 330. For example, circuitry layer 300 may include a top insulative layer 330a and a bottom insulative layer 330b. Insulative layer(s) 330 may be made of a hydrophobic material which may protect components of circuitry layer 300. Insulative layer 330 is described in further detail with regard to FIG. 8, below.

Circuitry layer 300 may further include an interfacing component 340. For example, interfacing component 340 may be an interconnect for connecting circuitry trace layer 310 with other circuitry components, including controls for electrical components, power, wake circuits, transmitters, memory, processors, or any other component which may be used in an electric circuit. Interfacing component 340 may include, for example, one or more terminals 342 for connecting to one or more electrodes 318. Terminals 342 may be configured to support different functions of circuitry layer 300. For example, terminals 342 may include different types of inputs and/or outputs. Interfacing component 340 may also include a substrate 344. Substrate 344 may be rigid, flexible, or a combination of rigid and/or flexible. Substrate 344 may also include several connected substrates. For example, substrate 344 may include multiple types of substrates, for example both a flexible substrate and a rigid substrate. Where multiple substrates 344 are used, substrates 344 may have different thicknesses.

Interfacing component 340 may also include a connector 346 for connecting circuitry layer 300 to an external component such as, for example, a power supply, a networked device (e.g., a computer, portable device, Bluetooth-enabled device, etc.), and/or another circuitry layer 300. Connector 346 may be a universal-type connector, such as any type of USB connector, a magnetic pogo pin connector, a JST connector, a headphone jack, or another type of connector used by other devices. Interfacing component 340 may also include multiple connectors 346. Interfacing component 340 may also include one or more component elements 348. Component elements 348 may include, for example, circuits, such as, by way of example, sleep/wake circuits, controllers, memory, processors, switches, etc.

As shown in FIG. 8, circuitry layer 300 may include an alternative circuitry trace layer 410. Circuitry trace layer 410 may have any of the qualities of circuitry trace layers 30, 140, and/or 310. Circuitry trace layer 410 may include different regions. For example, circuitry trace layer 410 may include a region 412 on which components (e.g., components 450, as discussed below), such as lights (e.g., LED lights) may be mounted. Circuitry trace layer 410 may also include a heating portion 414, which is configured to generate and transmit heat. For example, heating portion 414 may be used to transmit heat to a user, such as a wearer. While a capacitive touch portion is not shown as a portion of circuitry trace layer 410, circuitry trace layer 410 may include such a portion. Circuitry trace layer 410 may also include one or more electrodes 418, which may be used for forming electrical connections with other parts. One or more electrodes 418 may be connected to one or more terminals 342 (see FIG. 7) of interfacing component 340 with, for example, conductive epoxy, conductive ink, conductive bonding material, or other conducting material 420.

One or more components 450 may be mounted on circuitry trace layer 410 (or any of the other circuitry trace layers described herein). Components 450 may be for example, an input or an output device. For example, one or more components 450 may include, for example, lights such as LED lights, vibration motors, Bluetooth transmitters, GPS transmitters, biometric sensors, antennas, transceivers, switches, accelerometers, resistors, batteries, thermistors, temperature sensors, tilt pins, flex sensors, photocells, etc. Components 450 may include for example, one or more rigid electrical components, and/or one or more substrates (e.g., a rigid and/or flexible board). Electrical traces may be formed on the substrate, extending from the rigid electrical component. Each component 450 may be configured for communicating with another component 450 and/or an external device via wired or wireless communication. For example, component 450 may be configured for communicating wirelessly with an external device. In addition or in the alternative, each component 450 may be configured to communicate with an external device via interfacing component 340.

Components 450 may be electrically connected to circuitry trace layer 410 using, for example, conductive ink, conductive epoxy, ultrasonic welding, and/or other methods. Such conductive ink or conductive epoxy may have properties such that an electrical connection may be formed between portions of components 450 (e.g., electrical traces formed on a substrate) and circuitry trace layer 410. While not shown in FIG. 8, components 450 may also be used with, for example, circuitry trace layer 310 (e.g., in region 312) or any other circuitry layer, such as those formed with the methods described above in FIGS. 1-6. Circuitry layers 310 and 410 are merely exemplary of the types of circuitry layers which may be used as a portion of circuitry layer 300.

Components 450 may also be mechanically coupled to circuitry trace layer 410 (or any other circuitry trace layer). For example, components 450 may be mechanically coupled using, e.g., electrically-insulative or electrically-conductive thread or another similar material (e.g., wire). Components 450 may be perforated in advance to accept thread or another material used to mechanically couple components 450 to circuitry trace layer 410.

After one or more electrodes (e.g., electrodes 50, 160, 318, or 418) are electrically connected to one or more terminals 342 of interfacing component 340, and after any components 450 are electrically connected to a circuitry trace layer (such as circuitry trace layers 30, 140, 310, or 410), an insulative layer 330 may be placed over the circuitry trace layer (e.g., circuitry trace layers 30, 140, 310, or 410), components 450, and/or portions of interfacing component 340 such as terminals 342 or substrate 344. For example, insulative layer 330 may encase other components of circuitry layer 300. Insulative layer 330 may, for example, include insulative layers 330a and 330b placed on a top and bottom side, as shown in FIG. 7. Insulative layer 330 may serve as an electrical insulator, as well as a waterproof barrier preventing liquids from coming into contact with conductive and other electrical components of circuitry layer 300. In one embodiment, insulative layer 330 may be a hydrophobic coating. Insulative layer 330 may be made from, for example: manganese oxide polystyrene, zinc oxide polystyrene, and/or precipitated calcium carbonate. Insulative layer 330 may be applied, for example, as a liquid or as a film (e.g., thermoplastic polyurethane (TPU)). For example, where insulative layer 330 is a liquid, insulative layer 330 may be applied by coating, spraying, rolling, or the like. Where insulative layer 330 is a film, insulative layer may be, for example, a two-party film and may have press on or iron on qualities. Insulative layer 330 may be flexible—e.g., bendable, drapable, and/or stretchable. In addition or in the alternative to insulative layer 330, an oleophobic material may be applied in order to protect against water, oil, dirt, and/or other contaminants. Circuitry layer 300 may be washable without compromising the functionality of the circuitry layer 300.

Connector 346 may be connectable to an external device, such as external device 460. External device 460 may include a receptacle 462, which may be configured to receive a compatible connector 346. For example, receptacle 462 may be configured to receive a USB connector, a pogo pin connector, a JST connector, a headphone jack, or any other type of connector. External device 460 may include one or more receptacles 462, although only one receptacle 462 is shown in FIG. 8. Multiple external devices 460 may be used with a given circuitry layer 300, simultaneously or at different times.

As shown in FIG. 9, a method 500 for constructing a circuitry layer 300 may include forming circuitry traces in step 510. Step 510 may include the steps and/or methods described with regard to any of FIGS. 1-8. For example, step 510 may include steps of method 80 and/or method 200, as described with regard to FIGS. 3 and 6. In step 520, a circuit trace formed in step 510 (e.g., circuitry trace layers 30, 140, 310, and/or 310) may be connected to elements such as interface connector 340 and/or one or more components 350. In step 530, an insulating layer such as insulating layer 330 may be applied over a circuitry trace layer (e.g., circuitry trace layer 30, 140, 310 and/or 310), one or more component 350, and/or a portion of interfacing connector 340. As described above with regard to FIGS. 7-9, flexible circuitry layer 300 may be constructed without using wires or soldering. Thus, an entirety or almost an entirety of flexible circuitry layer 300 may be bent. For example, all of circuitry layer 300 may be bendable except for component(s) 350 and/or interfacing component 340. Flexible circuitry layer 300 may have a large or very large surface area of circuitry.

Figure 10:
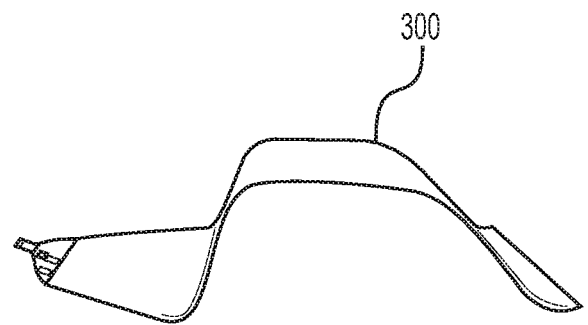
FIG. 10 shows an exemplary electronic circuitry layer.

As shown in FIG. 10, a circuitry layer 300, as described with regard to FIGS. 7 and 8, may be flexible or drapable. Depending on the materials used in construction of circuitry layer 300, circuitry layer 300 may also be stretchable. Circuitry layer 300 may have an ultra-low bend radius. For example, circuitry layer 300 may have a lower bend radius than a circuit constructed using flexible circuit board (e.g., less than 3 mm). Circuitry layer 300 may experience creasing with a pressure of between 40 and 60 PSI applied, with the resistance changing less than 5%. Even after being creased, circuitry layer 300 may not hold a permanent crease, contrary to traditional flex printed circuit board, which will hold a permanent crease (e.g., a crease area of 1 cm) and which will crack after multiple alternate side flexings. Circuitry layer 300 may also be crease resistant and robust for use in soft good products (such as soft good product 600, described below with regard to FIG. 11).

Figure 11:
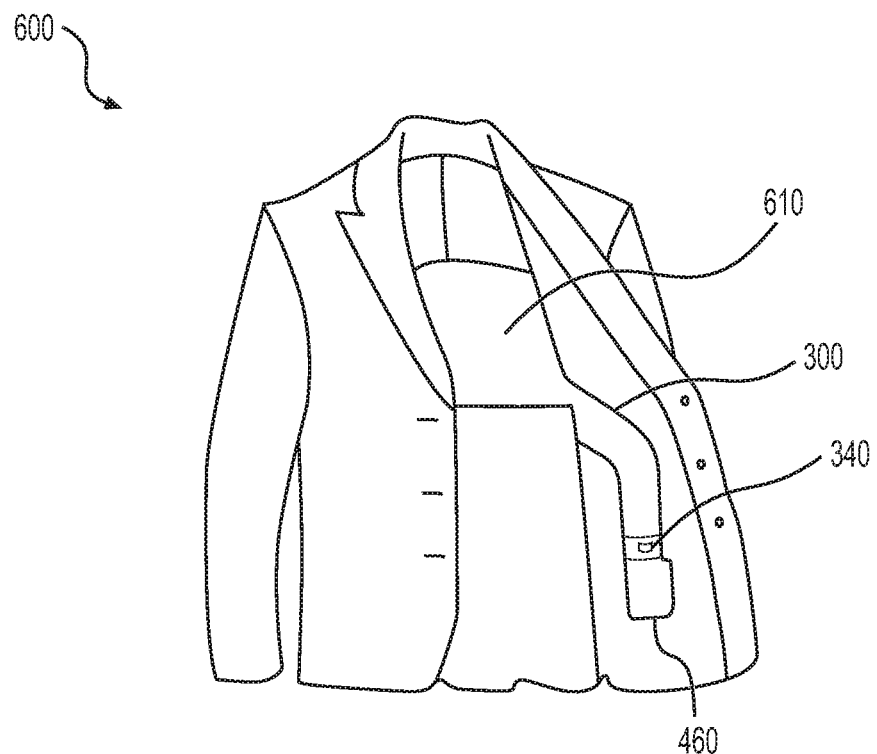
FIG. 11 shows an exemplary textile product incorporating an electronic circuitry layer.

As shown in FIG. 11, a circuitry layer 300 may be incorporated into a soft good 600. For example, circuitry layer 300 may form a flexible, fabric insert. For example, soft good 600 may be an item of clothing, such as a jacket, vest, shirt, pants, shorts, undergarment, sock, or other clothing item. Soft good 600 may also be, for example, an upholstered item such as furniture, a car seat, or another upholstered item. Soft good 600 may also be a hybrid soft and hard good, including, for example, a shoe or a tent. Soft good 600 may include a pouch or pocket 610. Pouch or pocket 610 may be configured (e.g., sized or shaped) for insertion of a circuitry layer 300. For example, pouch 610 may be sized to match a perimeter geometry of circuitry layer 300 (or vice versa—circuitry layer 300 may be formed to match a perimeter geometry of pouch 610). Circuitry layer 300 may include an interfacing component 340. Such a pouch or pocket 610 may be in, for example, a lining of soft good 600 or otherwise formed of a lining of soft good 600. Circuitry layer 300 may be fixedly or detachably attached to soft good 600. As discussed above with regard to FIGS. 7-8, a circuitry trace layer such as circuitry trace layer 310 or 310 may include one or more regions including capacitive touch or heating regions, which may be operable to provide functionality to circuitry layer 300, including when circuitry layer 300 is incorporated into soft good 600.

Interfacing component 340 may be connectable to an external device 460. Interfacing component 340 may be fixedly connected to external device 460 or detachably connected to external device 460. External device 460 may be, for example, a power source. External device 460 may be placed, for example, inside a soft good 600. For example, external device 460 may be configured to be stored in a pocket of a clothing item. Soft good 600 may be configured so that circuitry layer 300 may be connected to external device 460 via connector 340 while soft good 600 is worn or otherwise used. External device 460 may be able to be swapped out if, for example, a battery in external device 460 is depleted.

These and other embodiments of the systems and methods may be used as would be recognized by those skilled in the art. The above descriptions of various systems and methods are intended to illustrate specific examples and describe certain ways of making and using the systems disclosed and described here. These descriptions are neither intended to be nor should be taken as an exhaustive list of the possible ways in which these systems can be made and used. A number of modifications, including substitutions of systems between or among examples and variations among combinations can be made. Those modifications and variations should be apparent to those of ordinary skill in this area after having read this disclosure.

The systems, apparatuses, devices, and methods disclosed herein are described in detail by way of examples and with reference to the figures. The examples discussed herein are examples only and are provided to assist in the explanation of the apparatuses, devices, systems and methods described herein. None of the features or components shown in the drawings or discussed below should be taken as mandatory for any specific implementation of any of these the apparatuses, devices, systems or methods unless specifically designated as mandatory. For ease of reading and clarity, certain components, modules, or methods may be described solely in connection with a specific figure. In this disclosure, any identification of specific techniques, arrangements, etc. are either related to a specific example presented or are merely a general description of such a technique, arrangement, etc. Identifications of specific details or examples are not intended to be, and should not be, construed as mandatory or limiting unless specifically designated as such. Any failure to specifically describe a combination or sub-combination of components should not be understood as an indication that any combination or sub-combination is not possible. It will be appreciated that modifications to disclosed and described examples, arrangements, configurations, components, elements, apparatuses, devices, systems, methods, etc. can be made and may be desired for a specific application. Also, for any methods described, regardless of whether the method is described in conjunction with a flow diagram, it should be understood that unless otherwise specified or required by context, any explicit or implicit ordering of steps performed in the execution of a method does not imply that those steps must be performed in the order presented but instead may be performed in a different order or in parallel.

Reference throughout the specification to "various embodiments," "some embodiments," "one embodiment," "some example embodiments," "one example embodiment," or "an embodiment" means that a particular feature, structure, or characteristic described in connection with any embodiment is included in at least one embodiment. Thus, appearances of the phrases "in various embodiments," "in some embodiments," "in one embodiment," "some example embodiments," "one example embodiment, or "in an embodiment" in places throughout the specification are not necessarily all referring to the same embodiment. Furthermore, the particular features, structures or characteristics may be combined in any suitable manner in one or more embodiments.

Throughout this disclosure, references to components or modules generally refer to items that logically can be grouped together to perform a function or group of related functions. Like reference numerals are generally intended to refer to the same or similar components. Components and modules can be implemented in software, hardware, or a combination of software and hardware. The term "software" is used expansively to include not only executable code, for example machine-executable or machine-interpretable instructions, but also data structures, data stores and computing instructions stored in any suitable electronic format, including firmware, and embedded software. The terms "information" and "data" are used expansively and includes a wide variety of electronic information, including executable code; content such as text, video data, and audio data, among others; and various codes or flags. The terms "information," "data," and "content" are sometimes used interchangeably when permitted by context. It should be noted that although for clarity and to aid in understanding some examples discussed herein might describe specific features or functions as part of a specific component or module, or as occurring at a specific layer of a computing device (for example, a hardware layer, operating system layer, or application layer), those features or functions may be implemented as part of a different component or module or operated at a different layer of a communication protocol stack. Those of ordinary skill in the art will recognize that the systems, apparatuses, devices, and methods described herein can be applied to, or easily modified for use with, other types of equipment, can use other arrangements of computing systems such as client-server distributed systems, and can use other protocols, or operate at other layers in communication protocol stacks, than are described.

It is intended that the specification and examples be considered as exemplary only, with a true scope and spirit of the invention being indicated by the following claims.

What is claimed is:

1. A method of forming flexible circuitry layers, the method comprising:
   providing a conductive mesh forming at least a portion of a circuitry trace, the at least the portion of the circuitry trace comprising an electrode, an interfacing component having a plurality of terminals and a connector, wherein the connector is adapted for connection to an external device, and an insulative layer;
   forming electrical connections between the electrode of the circuitry trace of the conductive mesh and the plurality of terminals of the interfacing component; and
   encasing the at least the portion of the circuitry trace of the conductive mesh with the insulative layer.

2. The method of claim 1, further comprising connecting the connector of the interfacing component to an external device.

3. The method of claim 2, wherein the connecting step includes connecting at least one of a USB connector, a magnetic pogo pin connector, a JST connector, or a headphone jack to the external device.

4. The method of claim 1, wherein the providing the conductive mesh includes providing at least one of a lighting region, a heating region, or a sensing region, wherein the at least one of the lighting region, the heating region, or the sensing region is included in the at least the portion of the circuitry trace.

5. The method of claim 1, further comprising attaching an electrical component to the circuitry trace, and wherein forming electrical connections includes forming an electrical connection between the electrical component and at least one of the plurality of terminals.

6. The method of claim 1, further comprising providing a conductive epoxy, and wherein forming electrical connections includes applying a conductive epoxy.

7. The method of claim 1, wherein the encasing step forms an encased portion of the circuit trace, and wherein the encased portion of the circuit trace has a bend radius of less than 1 mm.

8. The method of claim 1, wherein the provided conductive mesh is stretchable, and wherein a resistance of the at least the portion of the circuitry trace of the conductive mesh remains substantially the same upon stretching.

9. The method of claim 1, wherein the encasing step includes encasing at least a portion of the interfacing component with the insulative material so that at least one terminal of the plurality of terminals is encased by the insulative material and the connector is not encased by the insulative layer.

* * * * *